United States Patent
Namkoong et al.

(10) Patent No.: US 9,954,539 B2
(45) Date of Patent: Apr. 24, 2018

(54) METHOD AND APPARATUS FOR CLOCK PHASE GENERATION

(71) Applicant: Xilinx, Inc., San Jose, CA (US)

(72) Inventors: Jinyung Namkoong, San Jose, CA (US); Mayank Raj, San Jose, CA (US); Parag Upadhyaya, Los Gatos, CA (US); Vamshi Manthena, Cork (IE); Catherine Hearne, Fermoy (IE); Marc Erett, Ballinhassig (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/206,634

(22) Filed: Jul. 11, 2016

(65) Prior Publication Data

US 2018/0013435 A1 Jan. 11, 2018

(51) Int. Cl.
  *H03L 7/06* (2006.01)
  *H03L 7/089* (2006.01)
  *H03M 9/00* (2006.01)

(52) U.S. Cl.
  CPC ............ *H03L 7/0891* (2013.01); *H03M 9/00* (2013.01)

(58) Field of Classification Search
  CPC . H03L 7/14; H03L 7/141; H03L 7/143; H03L 7/145; H03L 7/146; H03L 7/148;
  (Continued)

(56) References Cited

U.S. PATENT DOCUMENTS 6,901,126 B1 * 5/2005 Gu .......................... H03L 7/0998
                                                                375/354
6,998,888 B1    2/2006 Song
                        (Continued)

FOREIGN PATENT DOCUMENTS

WO        2015073189        5/2015

OTHER PUBLICATIONS

Raj, Mayank et al., "A 4-to-11GHz Injection-Locked Quarter-Rate Clocking for an Adaptive 153fJ/b Opitcal Receiver in 28nm FDSOI CMOS," Proc. of the 2015 IEEE International Solid-State Circuits Conference, Feb. 22, 2015, pp. 404-406, IEEE, Piscataway, New Jersey, USA.

(Continued)

*Primary Examiner* — Patrick Chen
(74) *Attorney, Agent, or Firm* — Kin-Wah Tong; Carleton Clauss (57) ABSTRACT

A method, non-transitory computer readable medium, and circuit for clock phase generation are disclosed. The circuit includes an injection locked oscillator, a loop controller, and a phase interpolator. The injection locked oscillator includes an input for receiving an injected clock signal and an output for forwarding a set of fixed clock phases. The loop controller includes an input for receiving a phase separation error of the fixed clock phases and an output for forwarding a supply voltage derived from the phase separation error. The supply voltage matches the free running frequency of the injection locked oscillator to a frequency of the injected clock signal. The phase interpolator includes an input for receiving the set of fixed clock phases directly from the injection locked oscillator, an input for receiving the supply voltage from the loop controller, and an output for forwarding an arbitrary clock phase.

14 Claims, 5 Drawing Sheets

(58) Field of Classification Search
CPC ..... H03L 7/089; H03L 7/0891; H03L 7/0893; H03L 7/0895; H03L 7/0896; H03L 7/0898; H03M 9/00
USPC .......................................................... 327/157
See application file for complete search history.

(56) References Cited

U.S. PATENT DOCUMENTS

| | | | |
|---|---|---|---|
| 2001/0055331 A1* | 12/2001 | Agazzi | G01R 31/3004 375/216 |
| 2003/0062936 A1 | 4/2003 | Kennedy et al. | |
| 2014/0241442 A1* | 8/2014 | Ahmadi | H03L 7/00 375/259 |

OTHER PUBLICATIONS

Sidiropoulos, Stefanos et al., "Adaptive Bandwidth DLLs and PLLs using Regulated Supply CMOS Buffers," 2000 Symposium on VLSI Circuits Digest of Technical Papers, Jun. 15, 2000, pp. 124-127, IEEE, Piscataway, New Jersey, USA.

Liang, Che-Fu et al., "An Injection-Locked Ring PLL with Self-Aligned Injection Window," Digest of Technical Papers, 2011 IEEE International Solid-State Circuits Conference, Feb. 20, 2011, IEEE, Piscataway, New Jersey, USA.

* cited by examiner

METHOD AND APPARATUS FOR CLOCK PHASE GENERATION

TECHNICAL FIELD

The present disclosure generally relates to the field of digital communications and more particularly relates to clock phase generation by phase interpolators.

BACKGROUND

Many serializer/deserializer (SERDES) implementations used for high-speed digital communications utilize a phase interpolator to generate an arbitrary clock phase. In order to generate the arbitrary clock phase, the phase interpolator typically requires a set of fixed clock phases as inputs. The set of fixed clock phases may be generated centrally, and subsequently shared among multiple communication lanes via global distribution. Alternatively, the set of clock fixed phases may be generated locally in each communication lane, close to the destination.

A centrally generated set of fixed clock phases amortizes power costs among the multiple communication lanes, but increases the global buffering power and phase error accumulation necessary to distribute the set of fixed clock phases. A locally generated set of fixed clock phases consumes less global buffering power, but the power cost of generating the set of fixed clock phases cannot be amortized. As such, the decision to generate the set of fixed clock phases centrally or locally balances power and performance considerations.

SUMMARY

A method, non-transitory computer readable medium, and circuit for clock phase generation are disclosed. In one example, the circuit includes an injection locked oscillator, a loop controller, and a phase interpolator. The injection locked oscillator includes an input for receiving an injected clock signal and an output for forwarding a set of fixed clock phases. The loop controller includes an input for receiving a phase separation error of the fixed clock phases and an output for forwarding a supply voltage derived from the phase separation error. The supply voltage matches the free running frequency of the injection locked oscillator to a frequency of the injected clock signal. The phase interpolator includes an input for receiving the set of fixed clock phases directly from the injection locked oscillator, an input for receiving the supply voltage from the loop controller, and an output for forwarding an arbitrary clock phase.

In one example, the method includes generating, by an injection locked oscillator, a set of fixed clock phases using an injected clock signal. A supply voltage is found for the injection locked oscillator that will match a free running frequency of the injection locked oscillator to a frequency of the injected clock signal. The free running frequency of the injection locked oscillator is locked to the frequency of the injected clock signal, using the supply voltage. The injection locked oscillator then generates a new set of fixed clock phases, subsequent to the locking of the free running frequency. The new set of fixed clock phases is forwarded directly from the injection locked oscillator to a phase interpolator.

Other features will be recognized from consideration of the detailed description and the claims.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

To facilitate understanding, identical reference numerals have been used, where possible, to designate identical elements that are common to the figures.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

The present disclosure broadly discloses a method, non-transitory computer readable medium, and a circuit for clock phase generation that derives a frequency tracking supply voltage using an injection locked oscillator. As discussed above, a set of fixed clock phases used as input to a phase interpolator may be generated centrally or locally, and the decision to generate centrally or locally balances power and performance considerations. For instance, generating the set of fixed clock phases locally will consume more power, but the subsequent distribution of the locally generated clock phases will consume less power.

One example of the present disclosure provides a complementary metal-oxide semiconductor (CMOS)-based injection locked oscillator (ILO) and a CMOS-based phase interpolator in a frequency locking loop. A frequency tracking supply voltage found by the frequency locking loop can be used for both the ILO and the phase interpolator, which comprise similar CMOS circuit structures. Thus, when a supply voltage is found that tracks the incoming clock frequency to the ILO, the same supply voltage can also be applied to the phase interpolator to ensure that the circuit bandwidth tracks frequency. In further examples, the same frequency tracking supply voltage can also be used for a set of CMOS buffers. The ILO locally generates a set of fixed clock phases for use by the phase interpolator. The frequency tracking supply voltage is found from the phase separation error of the fixed clock phases and is set to drive the phase separation error to zero, so that even phase separation is maintained between the fixed clock phases. The even phase separation, in turn, improves the linearity of the clock phase generated by the phase interpolator.

Figure 1:
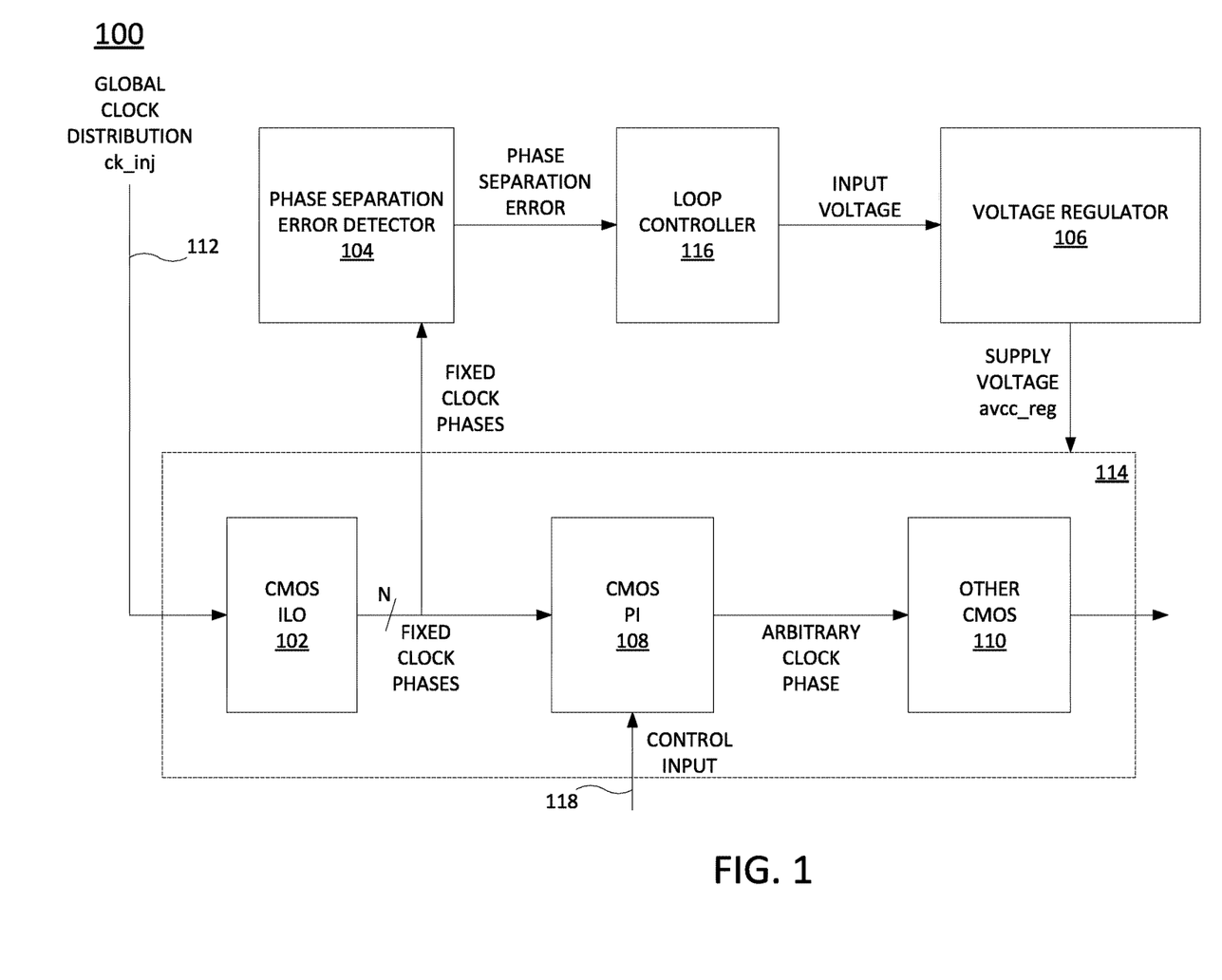
FIG. 1 illustrates, at a high level, an example circuit for clock phase generation.

FIG. 1 illustrates, at a high level, an example circuit 100 (e.g., implemented in part or in whole within a digital communication device such as a SERDES) for clock phase generation. In one example, the circuit 100 includes a CMOS-based injection locked oscillator (ILO) 102, a phase separation error detector 104, a voltage regulator 106, a CMOS-based phase interpolator (PI) 108, other CMOS circuitry 110, and a loop controller 116.

The CMOS-based ILO 102 includes an input to receive an injected global clock signal ck_inj 112. The CMOS-based ILO uses the global clock signal 112 to generate a set of fixed clock phases as outputs. One example of a CMOS-based ILO that may be deployed as the CMOS-based ILO 102 is illustrated in further detail in FIG. 2.

The phase separation error detector 104 includes at least one input coupled to an output of the CMOS-based ILO 102. The phase separation error detector 104 receives the set of fixed clock phases generated by the CMOS-based ILO 102 and processes the fixed clock phases in order to determine their phase separation error. Within the context of this disclosure, "phase separation error" refers to an amount by which the spacing between the fixed clock phases deviates from an even spacing (e.g., ninety degrees for a set of four fixed clock phases). For instance, the phase separation error may measure the separation between the in-phase (I) clock (e.g., zero degrees) and the quadrature (Q) clock (e.g., ninety degrees), as well as the separation between the Q clock and the inverted I clock (e.g., 180 degrees). Depending on which of these separations is bigger, the phase error can be derived. Thus, in one example, the phase separation error detector 104 performs in-phase and quadrature (IQ) error detection on the outputs of the CMOS-based ILO 102, although other techniques for phase separation error detection that no not assume a ninety degree separation between clock phases may also be implemented.

The loop controller 116 includes at least one input coupled to an output of the phase separation error detector 104. The loop controller 116 receives the phase separation error of the fixed clock phases generated by the CMOS-based ILO 102, and, from the phase separation error, determines a supply voltage that will match the free running frequency of the CMOS-based ILO 102 to the frequency of the incoming global clock 112. In one example, the supply voltage is found by directly driving the phase separation error toward zero. One method for finding the supply voltage by driving the phase separation error toward zero is described in detail by Raj et al. in "A 4-to-11 GHz Injection-Locked Quarter-Rate Clocking for an Adaptive 153 fJ/b Optical Receiver in 28 nm FDSOI CMOS," 2015 IEEE International Solid-State Circuits Conference. The loop controller 116 may be implemented in analog or digital circuitry. For instance, an analog-based loop controller 116 might comprise a charge pump and loop filter combination, such as that used in some analog phase-locked loops. A digital-based loop controller 116 might comprise a simple accumulator, such as that used in some digital filters. In this case, if the phase separation error is positive, the output of the loop controller 116 (i.e., the supply voltage) will increase; if the phase separation error is negative, the output of the loop controller 116 will decrease. The output of the loop controller 116 is provided to the voltage regulator 106 as an input voltage.

The voltage regulator 106 includes at least one input coupled to an output of the loop controller 116. The voltage regulator 106 receives the input voltage generated by the loop controller 116 and uses the input voltage to maintain a fixed supply voltage (avcc_reg) as an output. The voltage regulator 106 maintains this fixed supply voltage regardless of other disturbances, such as power supply noise. In one example, the input voltage received from the loop controller 116 is the same as the fixed supply voltage avcc_reg output by the voltage regulator 106.

The output of the voltage regulator (i.e., the supply voltage avcc_reg) is delivered directly to a sub-circuit 114 including the CMOS-based ILO 102, the CMOS-based PI 108, and the other CMOS circuitry 110. In one example, the supply voltage avcc_reg is delivered directly to the CMOS-based ILO 102, directly to the CMOS-based PI 108, and directly to the other CMOS circuitry 110. In another example, however, the supply voltage avcc_reg is delivered to the CMOS-based PI 108 and to the other CMOS circuitry 110 as a separate supply voltage that tracks with the supply voltage avcc_reg. For instance, there may be some offset between supply voltages (e.g., the supply voltage to the CMOS-based PI 108 is ten milliVolts higher than the supply voltage avcc_reg), or there may be a ratio of supply voltages (e.g., the supply voltage to the CMOS-based PI 108 is ten percent higher than the supply voltage avcc_reg). In either case, however, the supply voltages move together. Thus, if the supply voltage avcc_reg moves up, the supply voltage for the CMOS-based PI 108 will also move up.

In the CMOS-based ILO 102, the supply voltage is used to frequency-lock the free running frequency (i.e., the natural oscillating frequency) of the CMOS-based ILO 102 to the frequency of the injected global clock signal 112, as described in further detail in connection with FIG. 2.

The CMOS-based PI 108 includes inputs coupled both to an output of the CMOS-based ILO 102 and to an output of the voltage regulator 106. Additionally, the CMOS-based PI 108 includes an input for receiving a control input 118 (e.g., a set of digital bits from a clock and data recovery (CDR) circuit). The CMOS-based PI 108 receives the outputs of the CMOS-based ILO 102 and, using the control input 118, determines which of these outputs to output as an arbitrary clock phase. One example of a CMOS-based PI that may be deployed as the CMOS-based PI 108 is illustrated in further detail in FIG. 3.

The other CMOS circuitry 110 may include CMOS buffers or other circuitry having inputs connected to the output of the CMOS-based PI 108, for receiving the set of fixed clock phases. At least some of the other CMOS circuitry 110 additionally include inputs connected to the output of the voltage regulator 106, for receiving the supply voltage avcc-reg.

Thus, the supply voltage avcc_reg derived from the outputs of the CMOS-based ILO 102 is used for subsequent CMOS blocks in which it may be desirable for the circuit bandwidth to track operating frequency, including the CMOS-based PI 108 and other CMOS circuitry 110. In particular, the frequency tracking supply voltage avcc_reg can be used for both the CMOS-based ILO 102 and the CMOS-based PI 108, which comprise similar CMOS circuit structures. When both the ILO and the PI use CMOS gates, using a common supply voltage is a simple and effective way to control circuit bandwidth. In particular, when the supply voltage is found that tracks the incoming clock frequency to the CMOS-based ILO 102, the same supply voltage can also be applied to the CMOS-based PI 108 to ensure that the circuit bandwidth tracks frequency.

When the circuit bandwidth tracks the frequency, the linearity of the CMOS-based PI's output will be improved. For good linearity, the clock rising time should be similar to the clock phase separation. For instance, if mixing two clock phases that are ninety degrees apart, the clock rising time should be larger than twenty-five percent of the clock period; if mixing two clock phases that are forty-five degrees apart, the clock rising time should be larger than 12.5 percent of the clock period; etc. If a fixed voltage other than the frequency tracking supply voltage avcc_reg were used to supply power to the CMOS-based PI 108, the clock rising time might be too fast for a slow clock and result PI outputs that are not linear.

The circuit 100 thus places the CMOS-based ILO 102 in a frequency locking loop configuration that is driven by the phase separation error detector 104. This configuration increases the locking range of the CMOS-based ILO 102 and minimizes the phase error. The frequency locking loop adjusts the supply voltage avcc_reg of the CMOS-based ILO 102 to lock where the phase separation error is zero. Thus, the supply voltage that is found by the voltage regulator 106 tracks with the clock injection frequency.

Moreover, by placing the CMOS-based PI 108 after the CMOS-based ILO 102, and under the same supply voltage as the CMOS-based ILO 102 (as found by the voltage regulator 106), the linearity of the CMOS-based PI 108 can be improved without the use of a separate phase separation error correction block prior to the CMOS-based PI 108 (since the phase separation error of the CMOS-based ILO's outputs is already minimized by the loop prior to the outputs being forwarded to the CMOS-based PI 108).

Thus, a set of fixed clock phases for use by the CMOS-based PI 108 can be generated locally, and global distribution will utilize a single phase or pair of phases to carry frequency information. This minimizes power consumption both in the clock phase generation stage and in the distribution stage.

Figure 2:
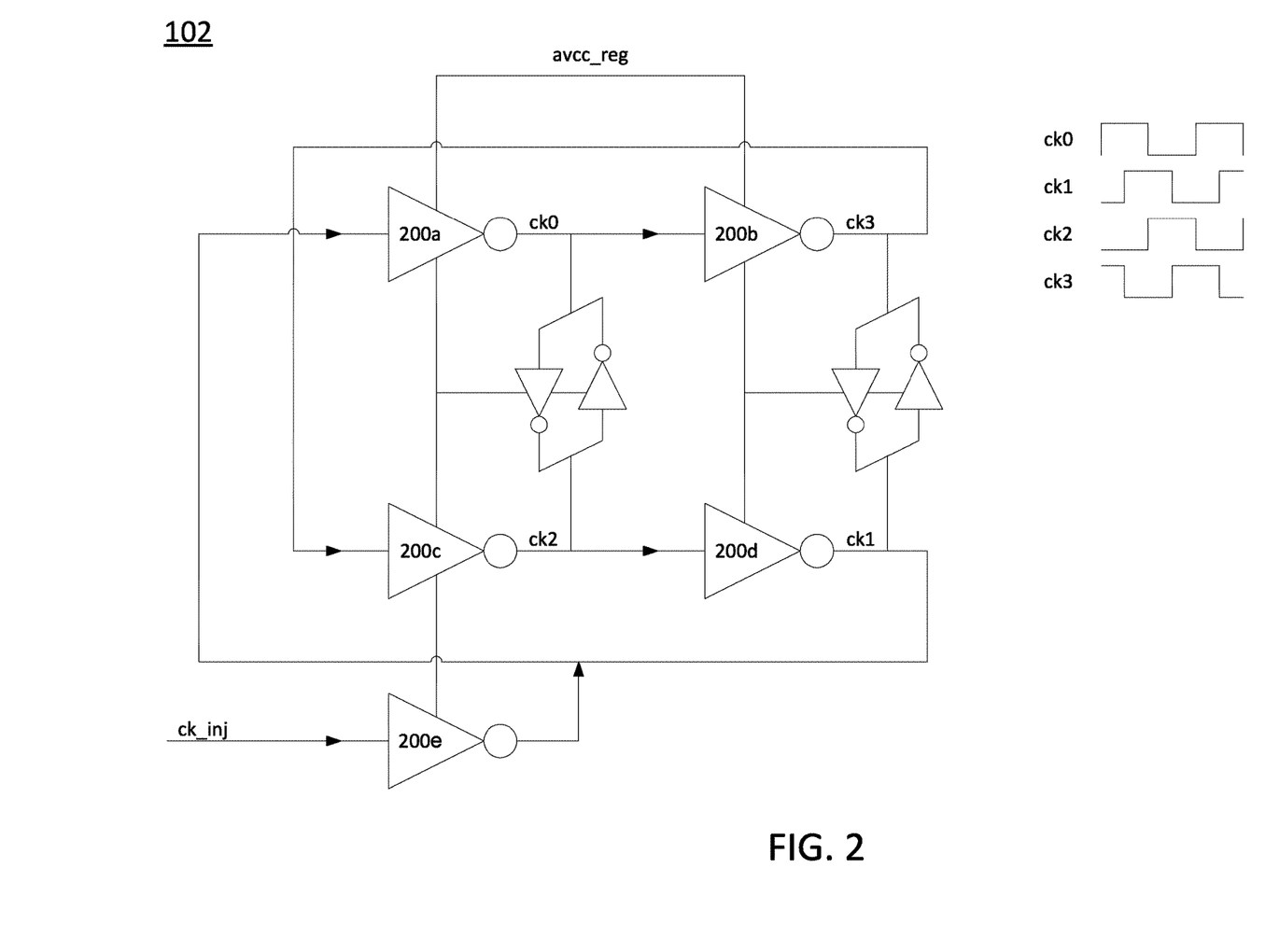
FIG. 2 illustrates an example implementation of two stages of the complementary metal-oxide semiconductor-based injection locked oscillator of FIG. 1 in more detail.

FIG. 2 illustrates an example implementation of two stages of the CMOS-based ILO 102 of FIG. 1 in more detail. It should be noted that FIG. 2 presents only one example configuration for the CMOS-based ILO 102, and that other, different configurations may also be possible. For instance, the CMOS-based ILO 102 may comprise any number of stages. Moreover, although a single-ended output is illustrated, in further examples, the CMOS-based ILO 102 may produce a pair of differential outputs. As discussed above, the CMOS-based ILO 102 is configured to generate a set of fixed clock phases for the CMOS-based PI 108; in the illustrated example, four clock phases ck0-ck3, separated by ninety degrees, are generated.

In one example, the CMOS-based ILO 102 comprises a plurality of inverters 200a-200e (hereinafter collectively referred to as "inverters 200"). Although FIG. 2 illustrates five inverters 200 (plus four more unlabeled inverters arranged in two cross-coupled configurations), any number of inverters might be used. Inverters 200a-200d are configured in a manner similar to a voltage controlled oscillator, while inverter 200e is included for injection of the clock signal ck_inj. In the illustrated example, clock injection is accomplished by shorting the output of the inverter 200e to clock phase ck3. However, in other examples, clock injection may be accomplished in different ways.

Without clock injection from the inverter 200e, the CMOS-based ILO 102 would oscillate at its free running frequency, which would be controlled by adjusting the supply voltage avcc_reg. However, when a clock signal ck_inj is injected at the inverter 200e, and the frequency of the injected clock signal is within locking range (i.e., a certain range of frequencies near the free running frequency of the CMOS-based ILO 102), the output frequency of the CMOS-based ILO 102 will be the same as the frequency of the injected clock signal ck_inj. In the example illustrated in FIG. 1, the phase separation error of the CMOS-based ILO's outputs (e.g., the clock phases ck0-ck3) is used to find the supply voltage avcc_reg that will match the CMOS-based ILO's free running frequency to the frequency of the injected clock signal ck_inj, and this supply voltage avcc_reg is fed back to the CMOS-based ILO 102 to control the free running frequency.

In addition, the phase noise, phase error (i.e., how even the separation is between the output set of fixed clock phases), and other performance measures of the CMOS-based ILO 102 may be improved when the free running frequency matches the frequency of the injected clock signal.

Figure 3:
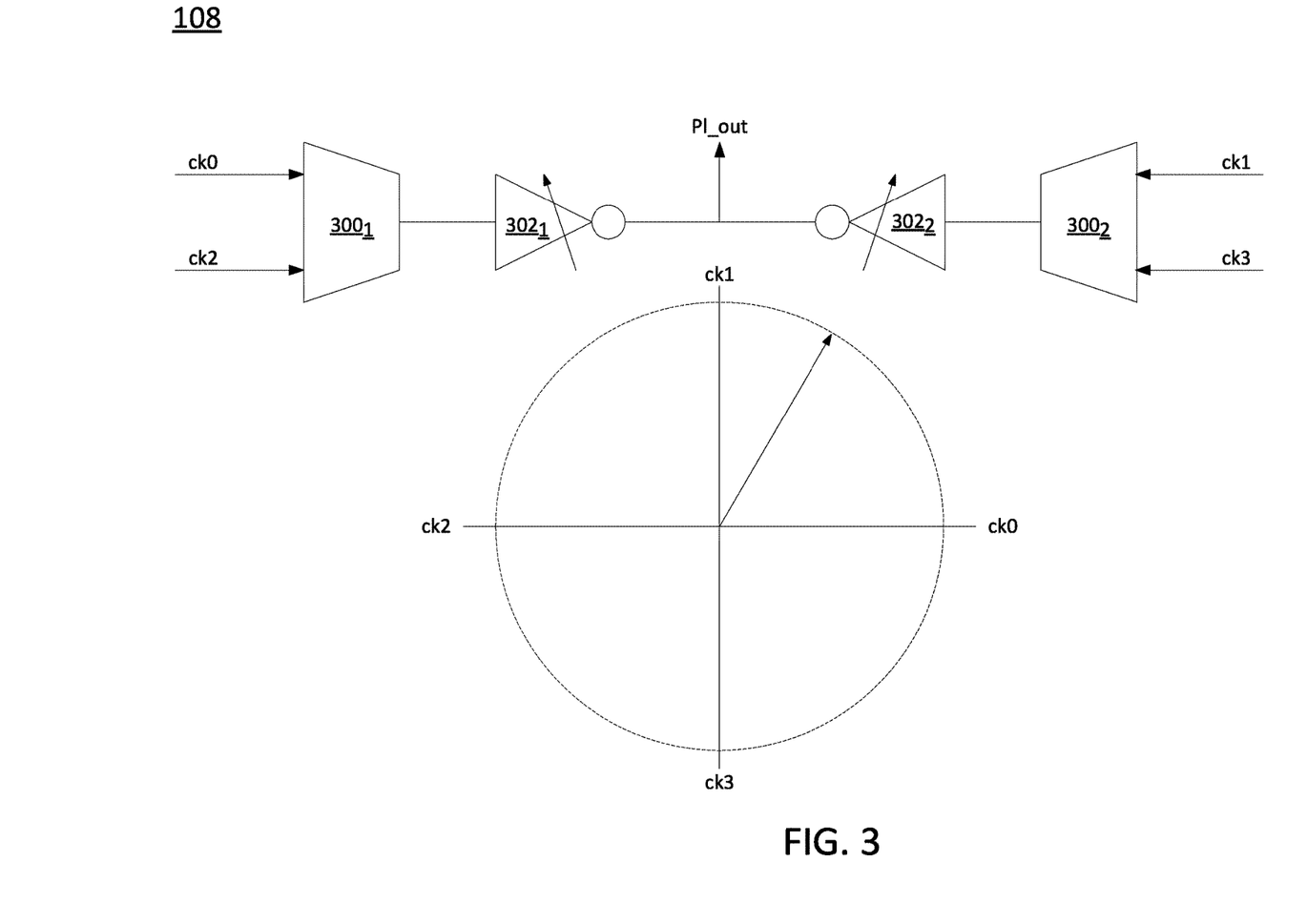
FIG. 3 illustrates an example implementation of the complementary metal-oxide semiconductor-based phase interpolator of FIG. 1 in more detail.

FIG. 3 illustrates an example implementation of the CMOS-based PI 108 of FIG. 1 in more detail. It should be noted that FIG. 3 presents only one example configuration for the CMOS-based PI 108, and that other, different configurations may also be possible. As discussed above, the CMOS-based PI 108 is configured to generate an arbitrary clock phase using a set of fixed clock phases received from the CMOS-based ILO 102; in the illustrated example, four fixed clock phases ck0-ck3, separated by ninety degrees, are used to generate the arbitrary clock phase, PI_out.

In one example, the CMOS-based PI 108 comprises two multiplexers $300_1$ and $300_2$ (hereinafter collectively referred to as "multiplexers 300") and two inverters $302_1$ and $302_2$ (hereinafter collectively referred to as "inverters 302").

Each multiplexer 300 comprises a plurality of inputs for receiving at least some of the fixed clock phases generated by the CMOS-based ILO 102 and a single output over which one of the fixed clock phases is forwarded for phase mixing. For instance, in the illustrated example, each multiplexer 300 is a two-to-one multiplexer. Each multiplexer 300 may be implemented using a plurality of CMOS tri-state inverters.

The output of each multiplexer 300 is coupled to the input of one of the inverters 302. In one example, each inverter 302 is implemented as an array of CMOS tri-state inverters. For instance, each inverter 302 may comprise sixteen CMOS tri-state inverters, for a total of thirty-two CMOS tri-state inverters. At any given time, half of the CMOS tri-state inverters are enabled. Phase mixing is then accomplished by enabling different numbers of the CMOS tri-state inverters in the two inverters 302. Following the above example, between the pair of inverters 302, sixteen different arbitrary clock phases could be generated (with sixty-four clock phases capable of being generated in each clock period).

Good linearity of the arbitrary clock phase PI_out that is output by the CMOS-based PI 108 can be achieved by maintaining even phase separation (e.g., in the illustrated example, ninety degrees) between the fixed clock phases generated by the CMOS-based ILO 102. In the disclosed example, this is achieved by positioning the phase separation error detector 104 between the CMOS-based ILO 102 and the CMOS-based PI 108, so that phase separation error detection and correction of the set of fixed clock phases occurs before the set of fixed clock phases is received by the CMOS-based PI 108.

Figure 4:
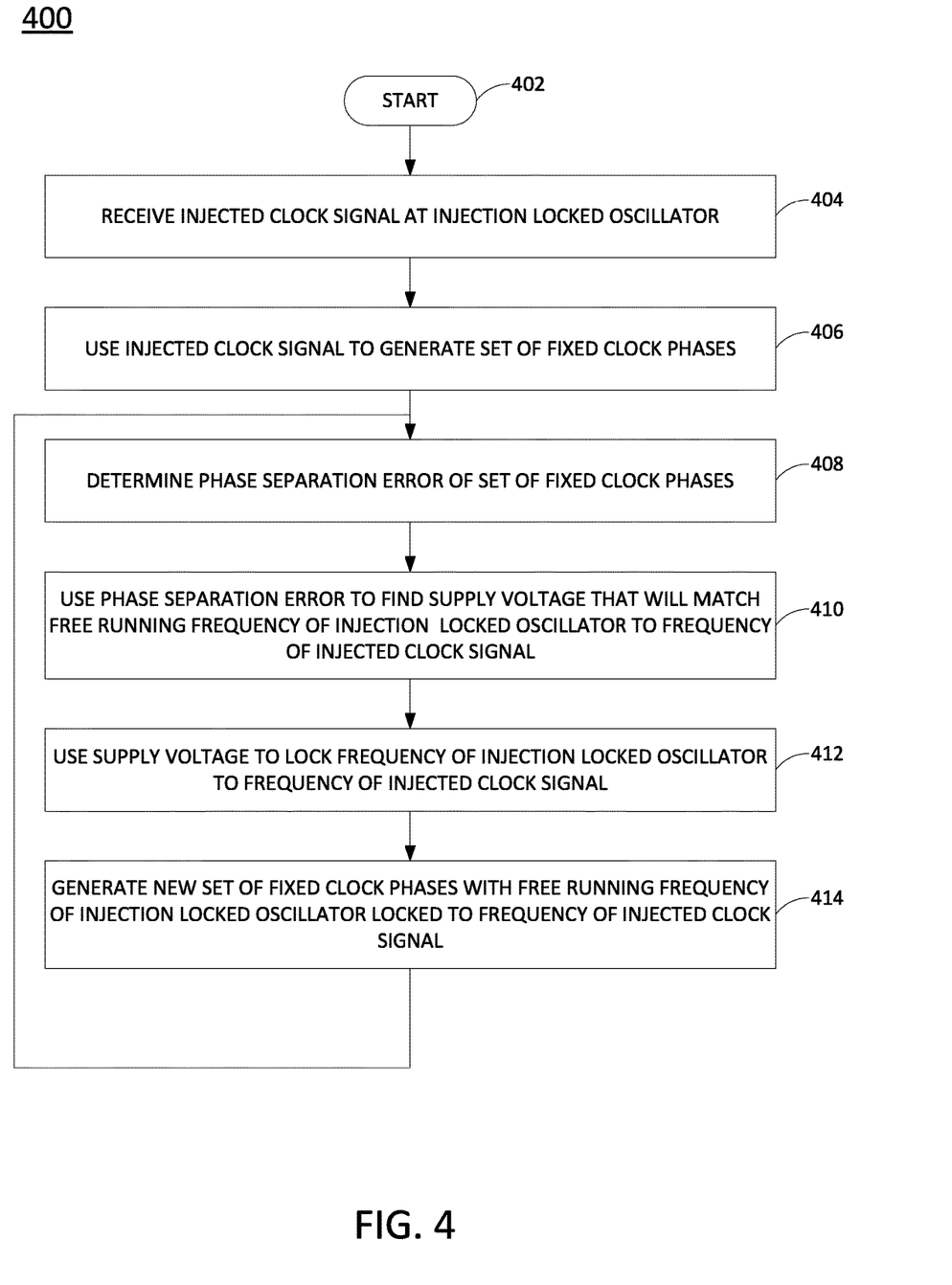
FIG. 4 illustrates a flowchart of a method 400 for clock phase generation.
Figure 5:
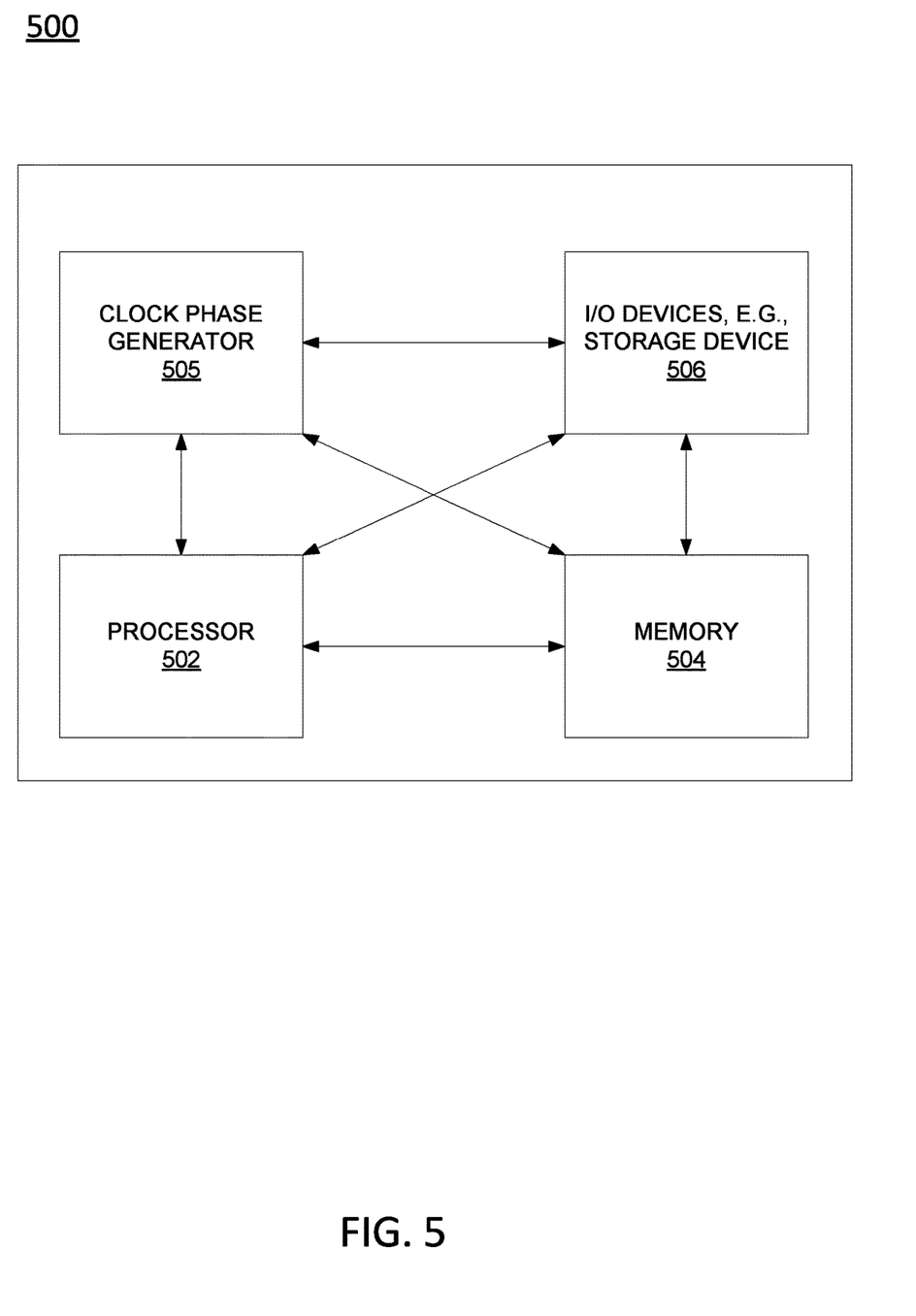
FIG. 5 illustrates a high-level block diagram of a general-purpose computer suitable for use in performing the functions described herein.

FIG. 4 illustrates a flowchart of a method 400 for clock phase generation. In one embodiment, the method 400 may be performed by components of the circuit 100 as illustrated in FIG. 1 or by a processor of a computing device as illustrated in FIG. 5 and discussed below. For the purposes of explanation, reference is made in the discussion of the method 400 to various elements of the circuit 100 illustrated in FIG. 1; however, the method 400 could be performed by a circuit or device having a configuration that differs from the configuration illustrated in FIG. 1.

The method 400 begins in step 402. In step 404, the CMOS-based ILO 102 receives an injected clock signal (e.g., ck_inj). In step 406, the CMOS-based ILO 102 generates a set of fixed clock signals, using the injected clock signal.

In step 408, the phase separation error detector 104 determines the phase separation error of the set of fixed clock signals.

In step 410, the loop controller 116 finds the supply voltage (e.g., avcc_reg) that will match the free running frequency of the CMOS-based ILO 102 to the frequency of the injected clock signal. In one example, the loop controller 116 finds this supply voltage from the phase separation error determined by the phase separation error detector 104 in step 408. For instance, the loop controller 116 may find the supply voltage by driving the phase separation error of the fixed clock signals toward zero.

In step 412, the CMOS-based ILO 102 uses the supply voltage found by the loop controller 116 in step 410 to lock its free running frequency to the frequency of the injected clock signal.

In step 414, the CMOS-based ILO 102 generates a new set of fixed clock phases, with its free running frequency now locked to the frequency of the injected clock signal. It is noted that steps 410-414 may be performed as a continuous process rather than a discrete set of steps. For instance, in one example, the CMOS-based ILO 102 always outputs a set of fixed clock phases based on its current supply voltage. However, if the free running frequency of the CMOS-based ILO 102 matches the frequency of the injected clock, then the phases of the set of fixed clock phases will be evenly spaced.

As discussed above, an arbitrary clock phase may be generated (e.g., by the CMOS-based PI 108) from the new set of fixed clock signals generated by the CMOS-based ILO 102 in step 414. In addition, the new set of fixed clock signals generated by the CMOS-based ILO 102 is fed back into the phase separation error detector 104. Thus, the method 400 returns to step 408 and proceeds as described above, using the new set of fixed clock signals to derive the phase separation error, and, subsequently, the supply voltage.

It should be noted that although not explicitly specified, one or more steps, blocks, or functions of the method 400 described above may include a storing, displaying and/or outputting step as required for a particular application. In other words, any data, records, fields, and/or intermediate results discussed in the methods can be stored, displayed, and/or outputted to another device as required for a particular application. Furthermore, steps, blocks, or functions in FIG. 4 that recite a determining operation, or involve a decision, do not necessarily require that both branches of the determining operation be practiced. In other words, one of the branches of the determining operation can be deemed as an optional step.

FIG. 5 depicts a high-level block diagram of a general-purpose computer or system suitable for use in performing the functions described herein. As depicted in FIG. 5, the system 500 comprises a hardware processor element (e.g., a CPU) or a hardware memory controller 502, a memory 504, e.g., random access memory (RAM) and/or read only memory (ROM), a module 505 for generating a clock phase and various input/output devices 506, e.g., any type of storage device, an output port, an input port and any number of interfaces.

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps or functions of the above disclosed method. In one example, the present module or process 505 for generating a clock phase can be loaded into memory 504 and executed by hardware processor/controller 502 to implement the functions as discussed above. As such, the present process 505 for generating a clock phase as discussed above in method 400 (including associated data structures) of the present disclosure can be stored on a non-transitory (e.g., tangible or physical) computer readable storage medium, e.g., RAM memory, magnetic or optical drive or diskette and the like.

While the foregoing describes exemplary embodiments in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:

1. A circuit, comprising:
an injection locked oscillator including an input for receiving an injected clock signal and an output for forwarding a set of fixed clock phases;
a loop controller including an input for receiving a phase separation error of the set of fixed clock phases and an output for forwarding a supply voltage derived from phase separation error, wherein the supply voltage matches a free running frequency of the injection locked oscillator to a frequency of the injected clock signal; and
a phase interpolator including an input for receiving the set of fixed clock phases directly from the injection locked oscillator, an input for receiving the supply voltage from the loop controller, and an output for forwarding an arbitrary clock phase,
wherein the phase interpolator comprises:
a plurality of multiplexers, each multiplexer of the plurality of multiplexers including a plurality of inputs, and each input of the plurality of inputs being configured for receiving one clock phase of the set of fixed clock phases; and
a plurality of inverters, each inverter of the plurality of inverters having an input for receiving an output of one multiplexer of the plurality of multiplexers.

2. The circuit of claim 1, wherein the loop controller finds the supply voltage by driving the phase separation error toward zero.

3. The circuit of claim 1, further comprising:
a phase separation error detector for receiving the set of fixed clock phases and an output for forwarding the phase separation error of the set of fixed clock phases.

4. The circuit of claim 3, wherein the injection locked oscillator, the phase separation error detector, and the loop controller comprise a frequency locking loop driven by the phase separation error detector.

5. The circuit of claim 3, wherein the phase separation error detector is programmed to perform in-phase and quadrature error detection on the set of fixed clock phases.

6. The circuit of claim 1, further comprising:
a set of buffers having an input for receiving the arbitrary clock phase and an input for receiving the supply voltage.

7. The circuit of claim 1, wherein the circuit is part of a serializer/deserializer.

8. The circuit of claim 1, wherein the loop controller comprises a charge pump and a loop filter.

9. The circuit of claim 1, wherein the loop controller comprises an accumulator.

10. The circuit of claim 1, wherein the injection locked oscillator comprises:
a plurality of complementary metal-oxide semiconductor inverters arranged to form a voltage controlled oscillator, wherein each of the plurality of complementary metal-oxide semiconductor inverters includes an output for forwarding one clock phase of the set of fixed clock phases; and
a single complementary metal-oxide semiconductor inverter having an input for receiving the injected clock signal.

11. The circuit of claim 10, wherein the single complementary metal-oxide semiconductor further includes an output shorted to one clock phase of the set of fixed clock phases.

12. The circuit of claim 1, wherein each multiplexer of the plurality of multiplexers is implemented using a plurality of complementary metal-oxide semiconductor tri-state inverters.

13. The circuit of claim 1, wherein each inverter of the plurality of inverters is implemented as an array of complementary metal-oxide semiconductor tri-state inverters, and phase mixing of the set of fixed clock phases is accomplished by enabling different numbers of complementary metal-oxide semiconductor tri-state inverters in the plurality of inverters.

14. A circuit, comprising:
an injection locked oscillator including an input for receiving an injected clock signal and an output for forwarding a set of fixed clock phases;
a loop controller including an input for receiving a phase separation error of the set of fixed clock phases and an output for forwarding a supply voltage derived from phase separation error, wherein the supply voltage matches a free running frequency of the injection locked oscillator to a frequency of the injected clock signal; and
a phase interpolator including an input for receiving the set of fixed clock phases directly from the injection locked oscillator, an input for receiving the supply voltage from the loop controller, an input for receiving a digital control signal from a clock and data recovery circuit, and an output for forwarding an arbitrary clock phase, wherein the phase interpolator is configured to select one of the set of fixed clock phases to output as the arbitrary clock phase using the digital control signal.

* * * * *